US011588446B2

(12) United States Patent
Westphal

(10) Patent No.: US 11,588,446 B2
(45) Date of Patent: Feb. 21, 2023

(54) SIGNAL AMPLIFIER CIRCUIT, VOLTAGE CONVERTER AND SYSTEM

(71) Applicant: BURMESTER AUDIOSYSTEME GmbH, Berlin (DE)

(72) Inventor: Ernst-Heinrich Westphal, Berlin (DE)

(73) Assignee: BURMESTER AUDIOSYSTEME GmbH, Berlin (DE)

( * ) Notice: Subject to any disclaimer, the term of this patent is extended or adjusted under 35 U.S.C. 154(b) by 0 days.

(21) Appl. No.: 17/829,629

(22) Filed: Jun. 1, 2022

(65) Prior Publication Data

US 2022/0294397 A1   Sep. 15, 2022

Related U.S. Application Data

(62) Division of application No. 16/608,995, filed as application No. PCT/EP2018/060931 on Apr. 27, 2018, now Pat. No. 11,387,787.

(30) Foreign Application Priority Data

Apr. 28, 2017   (DE) .......................... 102017109213.7
Apr. 28, 2017   (DE) .......................... 102017109216.1

(51) Int. Cl.
    *H03F 3/183*   (2006.01)
    *H02M 7/06*   (2006.01)
    *H03F 1/30*   (2006.01)

(52) U.S. Cl.
    CPC .............. *H03F 3/183* (2013.01); *H02M 7/06* (2013.01); *H03F 1/302* (2013.01); *H03F 2200/03* (2013.01); *H03F 2200/447* (2013.01)

(58) Field of Classification Search
    CPC ....... H03F 3/183; H03F 2200/03; H02M 7/06
    See application file for complete search history.

(56) References Cited

U.S. PATENT DOCUMENTS 2,927,276 A   3/1960 Herrmann
3,753,137 A   8/1973 Mattfeld et al.
(Continued)

FOREIGN PATENT DOCUMENTS

DE   102016108187 A1   11/2016
EA        025687 B1    1/2017
(Continued)

OTHER PUBLICATIONS

Office Action dated Oct. 4, 2022 for corresponding Japanese Patent Application No. 2020-510152.

*Primary Examiner* — Adolf D Berhane
*Assistant Examiner* — Afework S Demisse
(74) *Attorney, Agent, or Firm* — Bachman & LaPointe, P.C.

(57) ABSTRACT

The invention relates to a signal amplifier circuit for amplifying a signal, in particular an audio amplifier circuit, includes at least one first amplifier transistor (Q1) and at least one second amplifier transistor (Q2), wherein the first amplifier transistor (Q1) and the second amplifier transistor (Q2) are connected to one another in a push-pull circuit and are fed by an amplifier voltage source (V+, V−); and one or more bias diodes (D1, D2) thermally coupled in each case to an associated amplifier transistor (Q1, Q2), wherein the bias diodes (D1, D2) are arranged in a parallel connection with respect to the amplifying transistors (Q1, Q2) to reduce or avoid a crossover distortion, wherein the bias diodes (D1, D2) are fed at least partly by a voltage source (UA) which is independent of the amplifier voltage source (V+, V−). The invention furthermore relates to a system and a voltage converter for providing an output-side DC voltage, including a first transformer (T1) and a second transformer (T2) connected to the first transformer (T1).

16 Claims, 5 Drawing Sheets

(56) References Cited

U.S. PATENT DOCUMENTS

| | | |
|---|---|---|
| 3,919,655 A | 11/1975 | Crandall |
| 4,087,761 A | 5/1978 | Fukumoto et al. |
| 4,121,168 A | 10/1978 | Stitt |
| 4,302,727 A | 11/1981 | Iwamatsu |
| 4,392,174 A | 7/1983 | Cadet et al. |
| 4,401,951 A | 8/1983 | Tanaka |
| 4,523,154 A | 6/1985 | Congdon |
| 4,864,249 A | 9/1989 | Reiffin |
| 4,910,653 A | 3/1990 | Bargroff et al. |
| 5,877,914 A | 3/1999 | Gontowski, Jr. |
| 6,137,392 A | 10/2000 | Herbert |
| 6,809,609 B1 | 10/2004 | Shibata et al. |
| 2001/0050595 A1* | 12/2001 | Komuro ................ H03F 3/3069 330/267 |
| 2012/0049895 A1 | 3/2012 | Kawaguchi et al. |
| 2012/0275195 A1 | 11/2012 | Cividino et al. |
| 2020/0177094 A1* | 6/2020 | Nielsen .................. H02M 7/06 |

FOREIGN PATENT DOCUMENTS

| | | |
|---|---|---|
| JP | S5374348 A | 7/1978 |
| JP | S55-060316 A | 5/1980 |
| JP | 04042602 A | 2/1992 |
| JP | 09130155 A | 5/1997 |
| JP | H11-346120 A | 12/1999 |
| JP | 2000295050 A | 10/2000 |
| JP | 2008092310 A | 4/2008 |
| JP | 2012-070357 A | 5/2011 |
| JP | 2014-049975 A | 3/2014 |
| KR | 1019850001566 A | 10/1983 |
| RU | 2183380 C2 | 6/2002 |
| RU | 2579302 C1 | 4/2016 |
| SU | 504191 A1 | 2/1976 |

* cited by examiner

SIGNAL AMPLIFIER CIRCUIT, VOLTAGE CONVERTER AND SYSTEM

CROSS-REFERENCE TO RELATED APPLICATIONS

This application is a divisional of U.S. patent application Ser. No. 16/608,995, filed Oct. 28, 2019, which is a 371 of PCT/EP2018/060931, filed Apr. 27, 2018, which claims priority to DE 10 2017 109 216.1, filed Apr. 28, 2017 and DE 10 2017 109 213.7, filed Apr. 28, 2017.

BACKGROUND OF THE INVENTION

The invention relates to a signal amplifier circuit, in particular an audio amplifier circuit. In particular, an audio output stage circuit is involved here.

Present-day signal amplifiers are usually composed of amplifier transistors connected to one another in a push-pull circuit. This class of amplifiers is also referred to as class B amplifiers. The basic principle of such an amplifier consists in two complementary transistors being interconnected at their emitters and being connected by their collectors respectively to a positive and a negative amplifier voltage source. Proceeding from a symmetrical signal, in this case each of the two complementary transistors conducts during half an oscillation cycle. In more modern signal amplifiers, in particular in output stages in which high powers are generated, two or more transistors are often provided for each oscillation cycle, said transistors each covering a specific voltage range. Given two transistors per oscillation cycle, that means a push-pull circuit having four transistors, although amplifiers having up to 12 transistors are not unusual either.

If the base terminals of the two complementary transistors are directly connected to the input signal of the amplifier, then the problem of so-called crossover distortion often occurs. The reason for this is that the associated transistor does not conduct if its base-emitter threshold voltage is undershot, for which reason the crossover distortion occurs in the case of zero crossings of the input signal. In order to reduce or avoid crossover distortions, it must be ensured that at any time one of the transistors is always in the on state. This is achieved by means of a bias voltage of the base. In order to obtain sufficiently low crossover distortions, there is the need to apply a quite specific bias voltage. A specific quiescent current through the output stage is established on account of said bias voltage. If said quiescent current is too low, then around the zero crossing of the output current there is a range in which the gain of the output stage is significantly less than the value given sufficient turn-on. A crossover distortion thus still arises. By contrast, if the quiescent current is too high, then both branches of the push-pull circuit are active in the region of the zero crossing. A crossover distortion is then likewise obtained since the gain at the crossover point is then significantly higher than in the case of "normal" turn-on.

The temperature coefficient of the base-emitter threshold voltage of the transistor or of the transistors is negative. Therefore, the bias voltage has to decrease with the identical temperature coefficient in order that the distortion optimum can be maintained as the heat sink temperature changes. This is usually achieved by means of diodes, referred to hereinafter as bias diodes or sense diodes, the threshold voltage of which likewise has a negative temperature coefficient that is as similar as possible to the temperature coefficients of the base-emitter threshold voltage of the associated transistors.

In this case, each transistor is assigned a dedicated bias diode, and thermally coupled thereto. If a branch of the push-pull circuit is formed from a plurality of transistors, then a corresponding number of associated bias diodes are arranged in a diode chain in order to generate the bias voltage.

The quiescent current of the amplifier flows through the bias diodes, with the result that the bias voltage decreases to an extent similar to the base-emitter threshold voltage as the temperature of the transistors rises. The bias diodes are usually fed by the same amplifier voltage source that also supplies the amplifier transistors. For this purpose, a potentiometer is arranged in parallel with the bias diodes and sets the "offset value" of the bias voltage to the smallest possible distortions at an average expected operating temperature of the amplifier. However, said "offset value" is dependent on the quiescent current through the voltage-amplifying stage of the amplifier, said quiescent current in practice being greatly dependent on temperature, primarily if there is a desire to optimize the amplifier in respect of the criterion of speed, which is important particularly in the case of audio amplifiers. This results in an undesired fluctuation of the bias voltage, which can in turn lead to distortions at the amplifier output.

SUMMARY OF THE INVENTION

It is an object of the invention to provide a signal amplifier circuit which can amplify a signal with less distortion.

The object is achieved according to the invention by means of a signal amplifier circuit having the features disclosed herein. Advantageous developments of the invention are presented herein and in the dependent claims.

The invention is based on the consideration of making available to the bias diodes a current which is as precise as possible and which is as exactly reproducible as possible and is independent of temperature. This is achieved according to the invention by virtue of the fact that the bias diodes are fed at least partly by means of a voltage source which is independent of the amplifier voltage source. A voltage source which is independent of the amplifier voltage source for supplying the bias diodes or a bias circuit has the advantage that the amplifier circuit can be dimensioned independently of requirements of the voltage amplifier stage connected upstream. Independent of the amplifier voltage source can mean, in particular, that the voltage source is galvanically isolated from the amplifier voltage source. In particular, the voltage source does not obtain its energy directly or indirectly from the amplifier voltage source.

One possibility for realizing such a voltage source is the use of a battery for supplying the bias diodes. With preference, however, the voltage source is a continuous voltage source. That means, in particular, that the voltage source does not discharge and thus also does not have to be regularly charged or replaced. Such a voltage source can be realized for example by combining a solar cell with a constant light source, for example with one or more LEDs. With preference, for this purpose, a solar cell is placed opposite an LED array in a common housing. The LED/solar cell transition then forms a galvanic isolation. In addition, the LED/solar cell transition forms no or only very low coupling capacitances. As an alternative or in addition thereto, the voltage source can have at least one transformer for the purpose of galvanic isolation.

One preferred embodiment provides for the independent voltage source to be embodied as a floating voltage source in relation to the amplifying transistors. That means, in particular, that the voltage source does not constitute a shunt from the output of the voltage amplifier circuit to ground. To put it another way, the voltage source does not form an additional or further connection path between the voltage amplifier circuit and the ground of the voltage amplifier circuit or the signal ground. With preference, the current for the bias diodes and the bias resistor is not drawn from the amplifier voltage source, or is drawn to the same extent as it is fed back again symmetrically. The bias current through the bias diodes is thus impressed without influencing the signal current.

The voltage source should moreover preferably have no or only a very low coupling capacitance with respect to ground since (in the common mode) it "tracks" a signal frequency of the signal to be amplified and the coupling capacitance of said voltage source loads the high-impedance signal output of the amplifier circuit. Furthermore, the voltage source should preferably have no or only a negligible common-mode interference voltage since otherwise this interference voltage is fed into the signal path at the high-impedance signal output of the amplifier circuit.

One advantageous development provides for the bias diodes to be fed by means of the independent voltage source via a bias amplifier. By way of example, said bias amplifier can be a DC voltage amplifier, in particular a precision DC voltage amplifier, which is combined with an operational amplifier, for example. The temperature coefficients of the amplifying transistors and of the associated bias diodes usually differ by a specific factor, which is usually approximately 1.2. It is thus advantageous if the voltage dropped across the bias diodes is multiplied by this factor. The gain of the bias amplifier is preferably independent of temperature.

One expedient embodiment provides for the independent voltage source and/or the bias amplifier to be part of a constant-current source which feeds the bias diodes, in particular of a precision constant-current source. The constant-current source is thus composed of the voltage source and/or the bias amplifier and optionally further electronic components. Thus the constant current flowing through the bias diodes is always exactly reproducible and independent of temperature.

In accordance with one preferred development, provision is made for the constant-current source to be embodied in an adjustable fashion. It is thereby possible to set the "offset" of the bias voltage to extremely small distortions of the amplifier circuit by means of varying the constant current provided by the precision constant-current source. The forward voltage across a diode increases with the current and decreases with temperature. However, the temperature coefficient of the forward voltage is practically independent of the current.

One preferred embodiment provides for the bias diodes to be arranged in each case with the associated amplifier transistor in a common housing, or for the bias diodes to be arranged in each case on a heat sink of the associated amplifier transistor. With preference, a thermally closely coupled bias diode is provided for each amplifier transistor in order as to obtain an exact image of the chip temperatures of the amplifier transistors. While the integration of a diode in the housing of the amplifier transistor affords the advantage of a particularly close thermal coupling, it has the disadvantage, on the other hand, that the bias diode cannot be selected freely. It is then incumbent on the bias circuit to balance the different electronic properties present between the bias diode and the amplifier transistor.

The amplifier transistor(s) are/is preferably embodied as bipolar transistor(s).

One advantageous development provides for the at least one first amplifier transistor to comprise a plurality of first amplifier transistors connected to one another in a first Darlington circuit, and/or for the at least one second amplifier transistor to comprise a plurality of second amplifier transistors connected to one another in a second Darlington circuit. In a Darlington circuit, two, three or more amplifier transistors can be connected and act like a single amplifier transistor, but with a significantly higher (current) gain factor.

In one expedient embodiment, the signal amplifier circuit is embodied as an audio amplifier circuit, in particular as an audio output stage circuit. The signal amplified by means of the signal amplifier circuit is therefore an audio signal. An audio output stage circuit means, in particular, that an input amplifier stage is connected upstream of the signal amplifier circuit.

In accordance with one preferred development, provision is made for the independent voltage source to comprise an input-side first transformer having a first primary winding and a first secondary winding, and an output-side second transformer having a second primary winding and a second secondary winding, said second transformer being connected to the first transformer, wherein the first secondary winding of the first transformer is directly connected to the second primary winding of the second transformer. That means that the secondary winding or secondary coil of the first transformer is directly connected to the primary winding or primary coil of the second transformer. The fact that the first secondary winding of the first transformer is connected to the second primary winding of the second transformer means, in particular, that there is an electrical connection between the two windings, that is to say that the two transformers are connected in series. With preference, the first secondary winding of the first transformer is directly connected to the second primary winding of the second transformer. That means, in particular, that the current generated in the first secondary winding flows through the second primary winding without the current profile being significantly changed. Preferably, between the first secondary winding and the second primary winding, in this case, there are arranged at most only purely resistive elements, for example an ohmic resistor or one or more line segments.

The rectifier arranged between the second secondary winding and the output terminals preferably comprises a diode bridge in order to rectify the AC voltage present at the second secondary winding. Afterward, the rectified signal can preferably be freed of harmonics by means of further circuits. In particular, the use of a series coil or series inductor is advantageous here, optionally in interconnection with an output capacitor as a low-pass filter circuit. Alternatively or additionally, each diode of the rectifier can be provided with a parallel circuit of RC series circuits (so-called snubber). Oscillations during the off-state transition of the diodes are avoided as a result.

At its input terminals, the voltage source has to be supplied with a primary AC voltage. The frequency of the primary AC voltage, hereinafter "primary frequency", is preferably in a range of between 10 kHz and 1 MHz, preferably between 20 kHz and 500 kHz. Preferably, the primary AC voltage has a primary frequency of more than 20 kHz, 25 kHz, 30 kHz, 35 kHz or 40 kHz. The primary AC voltage can be generated for example by means of a DC voltage being converted into an AC voltage at higher frequency. This conversion can be effected by means of electronic power switches or by means of oscillators and linear amplifiers. In this case, electronic power switches generate rectangular driving, which provides for a high efficiency, in particular. Oscillators and linear amplifiers, by contrast, are suitable for sinusoidal driving, which supplies the lowest interference level. Furthermore, with the use of rectangular voltages it is possible for the latter to be "rounded" using LC filters, with the result that an interference level reduced further is obtained in conjunction with still very good efficiency.

The primary frequency is preferably chosen such that the primary AC voltage generates no additional voltage components in the amplified signal, for example on account of coupling effects. If the signal amplifier is an audio amplifier, then the primary frequency is with preference between, but preferably far away from, an audio band limit of approximately 20 kHz and the cut-off frequency of the audio amplifier, which is usually a few hundred kHz. The further away from the amplifier cut-off frequency the primary frequency is, the more effective the suppression of possible primary AC voltage disturbances on account of the negative feedback in the amplifier. By way of example, given an amplifier cut-off frequency of 500 kHz, a primary frequency of approximately 100 kHz would be appropriate. The separation with respect to the audio band limit would then be 80 kHz and the separation with respect to the amplifier cut-off frequency would then be 400 kHz.

Preferably, the first transformer has a first core separated from a second core of the second transformer, with the result that the magnetic flux of the first core substantially does not flow through the second core.

One advantageous development provides for the first secondary winding and/or the second primary winding to have a maximum of five turns, with preference a maximum of three turns, preferably a maximum of one turn. With preference, the first secondary winding and the second primary winding are formed by a short-circuited turn passing through both cores of the two transformers. In this case, the short-circuited turn can form a circle around a respective limb of the two cores, or cross in a figure of eight between these two limbs. A small number of turns or even such a short-circuited turn considerably reduces the capacitive coupling described above because energy is transferred from the first transformer to the second transformer by means of a high current with at the same time a very low voltage. The capacitive coupling between the first primary winding and the second secondary winding is considerably reduced both on account of the lower voltage and on account of the lower coupling capacitance of only one or a few turns.

The connection lines between the two transformers or the short-circuited turn can advantageously be additionally embodied with low inductance by means of transposition. In this way, it is possible to increase further the distance between the two transformers or between the two cores, which additionally reduces the capacitive coupling.

Preferably, the connection lines are led between the two transformers or the short-circuited turn is led through a tube or a ring composed of ferrite material, which extends from a core of the first transformer to a core of the second transformer if said cores are present. In this case, however, the tube or the ring is not permitted to touch the two cores. In this case, the tube or the ring can have a circular cross section, a square cross section or a cross section shaped in some other way. By means of the tube or the ring, the useful current through the connection lines or the short-circuited turn is substantially not influenced since the magnetic fluxes forming in the ferrite for electric currents flowing oppositely (in antiparallel) substantially cancel one another out. On the other hand, common-mode interference currents which flow through both connection lines or both lines of the short-circuited turn (in parallel) are attenuated by the ferrite.

Preferably, the two transformers are embodied in such a way that the first primary winding and/or the second secondary winding have a multiple of a number of turns of the first secondary winding and/or the second primary winding. This has the effect, in particular, that the voltage at the transition between the two transformers is small in relation to the input voltage and the output voltage of the transformer pair. Advantageously, the first primary winding and/or the second secondary winding are dimensioned in such a way, in particular have a number of turns in such a way, that a first secondary voltage present at the first secondary winding and a first primary voltage present at the first primary winding have a ratio of at most 25%.

One expedient embodiment provides for the first transformer and the second transformer to have substantially the same construction. In particular, in this embodiment, the first primary winding and the second secondary winding have an identical number of turns. Furthermore, the cores of the two transformers, if present, can be embodied identically. This ensures that the voltage present at the output of the second transformer substantially corresponds to the primary AC voltage present at the input terminals or at the input of the first transformer.

In accordance with one preferred development, provision is made for the second transformer and/or the rectifier to be surrounded by a shield connected to a terminal of the second primary winding of the second transformer. Such a shield results in a decoupling of the two transformers or the cores thereof and can be effected in addition or as an alternative to a decoupling by means of spatial separation of the two transformers. The shield is preferably achieved by means of a metal sheet or a metal grid which covers or at least partly surrounds the transformer and/or the rectifier. In this case, the connection of the shield to the second primary winding can be equated with a connection to a connection line between the two transformers or to the short-circuited turn.

Preferably, provision is made for a terminal of the second primary winding of the second transformer and/or a terminal of the first secondary winding of the first transformer to be grounded. Here, too, reference can be made to the fact that, in particular, the connection line between the two transformers or the short-circuited turn is grounded. If an above-described shield of the second transformer is provided, then this shield can likewise be grounded. Alternatively, it is possible for only the shield itself to be grounded, even if no grounding of the transformer terminals takes place.

One preferred embodiment provides for a terminal of the second primary winding of the second transformer to be dynamically kept at a reference potential which follows the signal to be amplified. This procedure is also referred to as "bootstrapping". By virtue of the fact that the connection line or the short-circuited turn dynamically follows the signal in terms of potential, it is possible to reduce a capacitive coupling to ground with capacitive decoupling from the primary side of the transformer pair remaining the same. For this purpose, the reference potential is preferably connected to the respective terminal, to the connection line or to the short-circuited turn via an impedance converter. The impedance converter can be formed for example by means of a buffer amplifier having a gain factor of substantially one. The reference potential can be, in particular, the signal (decoupled by an impedance converter) itself. Preferably, the impedance converter is realized by means of a push-pull circuit, in particular as a complementary emitter follower. In this case, the reference potential is preferably tapped off at both ends of a bias resistor and fed to the two inputs of the push-pull circuit. The signal at the output of the push-pull circuit is then used as a bootstrap signal.

An AC voltage is present across the second secondary winding of the second transformer. Said AC voltage results in an in-antiphase oscillation at the two terminals of the second secondary winding. Stray capacitances with respect to ground or with respect to the reference potential described above are always present from both terminals of the secondary winding. Said stray capacitances are generally not identical, and so a common-mode interference voltage can result therefrom, which is then present at the output of the voltage source.

In order to reduce or completely avoid this further common-mode interference voltage, one preferred embodiment provides for a terminal of the second secondary winding of the second transformer, via a first corrective capacitance, and/or for a further terminal of the second secondary winding, via a second corrective capacitance, to be connected to ground. Said stray capacitances can be compensated for by means of correct selection of the corrective capacitance(s). The corrective capacitances preferably have values in the range of between 0.5 pF and 10 pF. As an alternative to the grounding described above, provision can advantageously be made for a terminal of the second secondary winding of the second transformer, via a first corrective capacitance, and/or a further terminal of the second secondary winding, via a second corrective capacitance, to be dynamically connected to a reference potential. Here, too, the reference potential is preferably connected to the corrective capacitance or the corrective capacitances via an impedance converter, wherein the impedance converter can be formed by means of a buffer amplifier, for example.

The first corrective capacitance and/or the second corrective capacitance are/is preferably formed from one or more capacitors. The corrective capacitance preferably has a value of between 0.5 pF and 10 pF.

In all embodiments described above in which a first corrective capacitance and optionally a second corrective capacitance are provided, advantageously the first corrective capacitance and/or the second corrective capacitance are/is embodied in an adjustable fashion. By means of the adjustable corrective capacitance(s), it is possible to carry out the compensation of the stray capacitances while observing the output signal at the signal output of the of the signal amplifier circuit, it being endeavored to minimize the common-mode interference voltage in the output signal. An adjustable or variable capacitor is preferably used as adjustable corrective capacitance. The corrective capacitances are added to said stray capacitances to form respective total capacitances. Symmetry can be produced by matching both total capacitances. In this case, the contributions of both phase angles to the common-mode interference voltage at the secondary winding mutually cancel one another out and the common-mode interference voltage vanishes. Preferably, the first corrective capacitance is chosen such that an adjustment in both directions is possible with the second corrective capacitance in order always to be able to adjust to a minimum even in the case of production-dictated variations of the stray capacitances.

The three different compensation approaches for the independent voltage source: grounding/bootstrapping, corrective capacitance(s) and shielding were explained separately above. With preference, however, at least two compensation methods are used simultaneously. More preferably, all three compensation methods are implemented at the same time.

The above-described voltage source which is independent of the amplifier voltage source for supplying the bias diodes or a bias circuit, in the form of a voltage converter, can also be beneficial independently of the power amplifier described above and also in entirely different fields of application.

The invention thus also relates to a voltage converter for providing an output-side DC voltage. Furthermore, the invention relates to a system comprising a voltage converter and a consumer supplied by the voltage converter.

Such a voltage converter is usually assembled from a transformer and a rectifier. The transformer serves to adapt the voltage level of an oscillating primary voltage to the requirements of a downstream circuit. A galvanic isolation between the primary voltage and the circuit is achieved at the same time. The adapted AC voltage is rectified in the downstream rectifier in order to make a DC voltage available to the circuit. The rectifier generally comprises a diode bridge and a low-pass filter.

Even with very careful design, in the case of such a voltage converter, the occurrence of common-mode interference voltages in general cannot be completely avoided. Particularly in the field of application of medical metrology and in sophisticated audio technology, such common-mode interference voltages can influence the measured or amplified signal, with the result that undesired signal superpositions can occur.

It is an object of the invention to provide a voltage converter and a system in which common-mode interference voltages are reduced or avoided.

The object is achieved according to the invention by means of a voltage converter having the features disclosed herein and by means of a system having the features disclosed herein. Advantageous developments of the invention are presented herein and in the dependent claims.

The invention is based on the insight that, in a conventional transformer having a primary winding and a secondary winding, these two windings are coupled not only magnetically but also capacitively. As a result of the capacitive coupling of the windings, part of the primary-side AC voltage passes as common-mode voltage to the output of the rectifier. Both output lines of the voltage converter carry this voltage with respect to the primary-side reference potential. In order to reduce this capacitive coupling, according to the invention, a transformer pair composed of two transformers directly connected to one another is used instead of a single transformer. That means that the secondary winding or secondary coil of the first transformer is directly connected to the primary winding or primary coil of the second transformer.

The capacitive coupling is already reduced to a certain extent by the fact that in this way the distance between the input winding (first primary winding) and the output winding (second secondary winding) of the transformer pair can be increased independently of the size of the transformer. The common-mode interference present at the output voltage also decreases to the same extent to which the capacitive coupling is reduced.

The fact that the first secondary winding of the first transformer is connected to the second primary winding of the second transformer means, in particular, that there is an electrical connection between the two windings, that is to say that the two transformers are connected in series. With preference, the first secondary winding of the first transformer is directly connected to the second primary winding of the second transformer. That means, in particular, that the current generated in the first secondary winding flows through the second primary winding without the current profile being significantly changed. Preferably, between the first secondary winding and the second primary winding, in this case, there are arranged at most only purely resistive elements, for example an ohmic resistor or line segments.

The rectifier arranged between the second secondary winding and the output terminals preferably comprises a diode bridge in order to rectify the AC voltage present at the second secondary winding. Afterward, the ripple of the rectified signal can preferably be reduced by means of further circuits. In particular, the use of a series coil or series inductor is advantageous here, optionally in interconnection with an output capacitor as a low-pass filter circuit. Alternatively or additionally, each diode of the rectifier can be provided with a parallel circuit of RC series circuits (so-called snubber). Oscillations during the off-state transition of the diodes are avoided as a result.

The voltage converter according to any of the embodiments described above or below is preferably used to supply a signal-processing circuit or circuit section for very sensitive signals which are free in terms of potential. A circuit or a circuit section which can vary its potential dynamically with the signal to be processed or its reference potential is considered to be free in terms of potential. In this case, the voltage converter outputs a negligible common-mode interference voltage, such that it can be used to supply even high-impedance signal circuits, without influencing the signal to be processed.

Advantageously, a consumer which processes a signal is supplied with DC voltage by means of the voltage converter. Accordingly, the invention also relates to a corresponding system comprising a voltage converter according to any of the embodiments described above or below and a consumer supplied by means of the voltage converter. The consumer is advantageously a signal amplifier for the signal. The consumer can be, in particular, a signal measuring device, for example a medical measuring device, or an audio amplifier, in particular a signal-processing circuit within the output stage of an audio amplifier.

At its input terminals, the voltage converter has to be supplied with a primary AC voltage. The frequency of the primary AC voltage, hereinafter "primary frequency", is preferably in a range of between 1 kHz and 10 MHz, preferably between 10 kHz and 500 kHz. Preferably, the primary AC voltage has a primary frequency of more than 1 kHz, 5 kHz, 10 kHz, 20 kHz or 30 kHz. The primary AC voltage can be generated for example by means of a DC voltage being converted into an AC voltage at higher frequency. This conversion can be effected by means of electronic power switches or by means of oscillators and linear amplifiers. In this case, electronic power switches generate rectangular driving, which provides for a high efficiency, in particular. Oscillators and linear amplifiers, by contrast, are suitable for sinusoidal driving, which supplies the lowest interference level. Furthermore, with the use of rectangular voltages it is possible for the latter to be "rounded" using LC filters, with the result that an interference level reduced further is obtained in conjunction with still very good efficiency.

If the voltage converter is connected to a signal-processing consumer in a system, then the primary frequency is preferably chosen such that the primary AC voltage generates no additional voltage components in the processed signal, for example on account of coupling effects. If the consumer is an audio amplifier, then the primary frequency is with preference between, but preferably far away from, an audio band limit of approximately 20 kHz and the cut-off frequency of the audio amplifier, which is usually a few hundred kHz. The further away from the amplifier cut-off frequency the primary frequency is, the more effective the suppression of possible primary AC voltage disturbances on account of the negative feedback in the amplifier. By way of example, given an amplifier cut-off frequency of 500 kHz, a primary frequency of approximately 100 kHz would be appropriate. The separation with respect to the audio band limit would then be 80 kHz and the separation with respect to the amplifier cut-off frequency would then be 400 kHz.

Preferably, the first transformer has a first core separated from a second core of the second transformer, with the result that the magnetic flux of the first core substantially does not flow through the second core.

One advantageous development provides for the first secondary winding and/or the second primary winding to have a maximum of five turns, with preference a maximum of three turns, preferably a maximum of one turn. With preference, the first secondary winding and the second primary winding are formed by a short-circuited turn passing through both cores of the two transformers. In this case, the short-circuited turn can form a circle around a respective limb of the two cores, or cross in a figure of eight between these two limbs. A small number of turns or even such a short-circuited turn considerably reduces the capacitive coupling described above because energy is transferred from the first transformer to the second transformer by means of a high current with at the same time a very low voltage. The capacitive coupling between the first primary winding and the second secondary winding is considerably reduced both on account of the lower voltage and on account of the lower coupling capacitance of only one or a few turns.

The connection lines between the two transformers or the short-circuited turn can advantageously be additionally embodied with low inductance by means of transposition. In this way, it is possible to increase further the distance between the two transformers or between the two cores, which additionally reduces the capacitive coupling. Preferably, the connection lines are led between the two transformers or the short-circuited turn is led through a tube or a ring composed of ferrite material, which extends from a core of the first transformer to a core of the second transformer if said cores are present. In this case, however, the tube or the ring is not permitted to touch the two cores. In this case, the tube or the ring can have a circular cross section, a square cross section or a cross section shaped in some other way. By means of the tube or the ring, the useful current through the connection lines or the short-circuited turn is substantially not influenced since the magnetic fluxes forming in the ferrite for electric currents flowing oppositely (in antiparallel) substantially cancel one another out. On the other hand, common-mode interference currents which flow through both connection lines or both lines of the short-circuited turn (in parallel) are attenuated by the ferrite.

Preferably, the two transformers are embodied in such a way that the first primary winding and/or the second secondary winding have a multiple of a number of turns of the first secondary winding and/or the second primary winding. This has the effect, in particular, that the voltage at the transition between the two transformers is small in relation to the input voltage and the output voltage of the transformer pair. Advantageously, the first primary winding and/or the second secondary winding are dimensioned in such a way, in particular have a number of turns in such a way, that a first secondary voltage present at the first secondary winding and a first primary voltage present at the first primary winding have a ratio of at most 25%.

One expedient embodiment provides for the first transformer and the second transformer to have substantially the same construction. In particular, in this embodiment, the first primary winding and the second secondary winding have an identical number of turns. Furthermore, the cores of the two transformers, if present, can be embodied identically. This ensures that the voltage present at the output of the second transformer substantially corresponds to the primary AC voltage present at the input terminals or at the input of the first transformer.

In accordance with one preferred development, provision is made for the second transformer and/or the rectifier to be surrounded by a shield connected to a terminal of the second primary winding of the second transformer. Such a shield results in a decoupling of the two transformers or the cores thereof and can be effected in addition or as an alternative to a decoupling by means of spatial separation of the two transformers. The shield is preferably achieved by means of a metal sheet or a metal grid which covers or at least partly surrounds the transformer and/or the rectifier. In this case, the connection of the shield to the second primary winding can be equated with a connection to a connection line between the two transformers or to the short-circuited turn.

Preferably, provision is made for a terminal of the second primary winding of the second transformer and/or a terminal of the first secondary winding of the first transformer to be grounded. Here, too, reference can be made to the fact that, in particular, the connection line between the two transformers or the short-circuited turn is grounded. If an above-described shield of the second transformer is provided, then this shield can likewise be grounded. Alternatively, it is possible for only the shield itself to be grounded, even if no grounding of the transformer terminals takes place.

If the voltage converter is connected to a signal-processing consumer in a system, then as an alternative to the grounding described above, provision can advantageously be made for a terminal of the second primary winding of the second transformer, a terminal of the first secondary winding of the first transformer, the connection line between the two transformers and/or the short-circuited turn to be dynamically kept at a reference potential which follows the signal processed in the consumer.

This procedure is also referred to as "bootstrapping". By virtue of the fact that the connection line or the short-circuited turn dynamically follows the signal in terms of potential, it is possible to reduce a capacitive coupling to ground with capacitive decoupling from the primary side of the transformer pair remaining the same. For this purpose, the reference potential is preferably connected to the respective terminal, to the connection line or to the short-circuited turn via an impedance converter. The impedance converter can be formed for example by means of a buffer amplifier having a gain factor of substantially one. Preferably, the impedance converter is realized by means of a push-pull circuit, in particular as a complementary emitter follower. The reference potential can be, in particular, the signal itself. If the consumer is an audio amplifier, then the reference potential can be tapped off with preference at the amplifier input, more preferably at the input of an output stage of the audio amplifier.

An AC voltage is present across the second secondary winding of the second transformer. Said AC voltage is mutually in antiphase at the two terminals of the second secondary winding. Stray capacitances with respect to ground or with respect to the reference potential described above are always present from both terminals of the secondary winding. Said stray capacitances are generally not identical, and so a common-mode interference voltage can result therefrom, which is then present at the output of the voltage converter.

In order to reduce or completely avoid this further common-mode interference voltage, one preferred embodiment provides for a terminal of the second secondary winding of the second transformer, via a first corrective capacitance, and/or for a further terminal of the second secondary winding, via a second corrective capacitance, to be connected to ground. Said stray capacitances can be compensated for by means of correct selection of the corrective capacitance(s). The corrective capacitances preferably have values in the range of between 0.5 pF and 10 pF. If the voltage converter is connected to a signal-processing consumer in a system, then as an alternative to the grounding described above, provision can advantageously be made for a terminal of the second secondary winding of the second transformer, via a first corrective capacitance, and/or a further terminal of the second secondary winding, via a second corrective capacitance, to be dynamically connected to a reference potential. Here, too, the reference potential is preferably connected to the corrective capacitance or the corrective capacitances via an impedance converter, wherein the impedance converter can be formed by means of a buffer amplifier, for example.

The first corrective capacitance and/or the second corrective capacitance are/is preferably formed from one or more capacitors. The corrective capacitance preferably has a value of between 0.5 pF and 20 pF.

In all embodiments described above in which a first corrective capacitance and optionally a second corrective capacitance are provided, advantageously the first corrective capacitance and/or the second corrective capacitance are/is embodied in an adjustable fashion. By means of the adjustable corrective capacitance(s), it is possible to carry out the compensation of the stray capacitances while observing the output signal of the consumer, it being endeavored to minimize the common-mode interference voltage in the output signal. An adjustable or variable capacitor is preferably used as adjustable corrective capacitance. The corrective capacitances are added to said stray capacitances to form respective total capacitances. Symmetry can be produced by matching both total capacitances. In this case, the contributions of both phase angles to the common-mode interference voltage at the secondary winding mutually cancel one another out and the common-mode interference voltage vanishes. Preferably, the first corrective capacitance is chosen such that an adjustment in both directions is possible with the second corrective capacitance in order always to be able to adjust to a minimum even in the case of production-dictated variations of the stray capacitances.

The three different compensation approaches: grounding/bootstrapping, corrective capacitance(s) and shielding were explained separately above. With preference, however, at least two compensation methods are used simultaneously. More preferably, all three compensation methods are implemented at the same time.

BRIEF DESCRIPTION OF THE DRAWINGS

The invention is explained below on the basis of exemplary embodiments with reference to the figures, in which.

DETAILED DESCRIPTION

Figure 1:
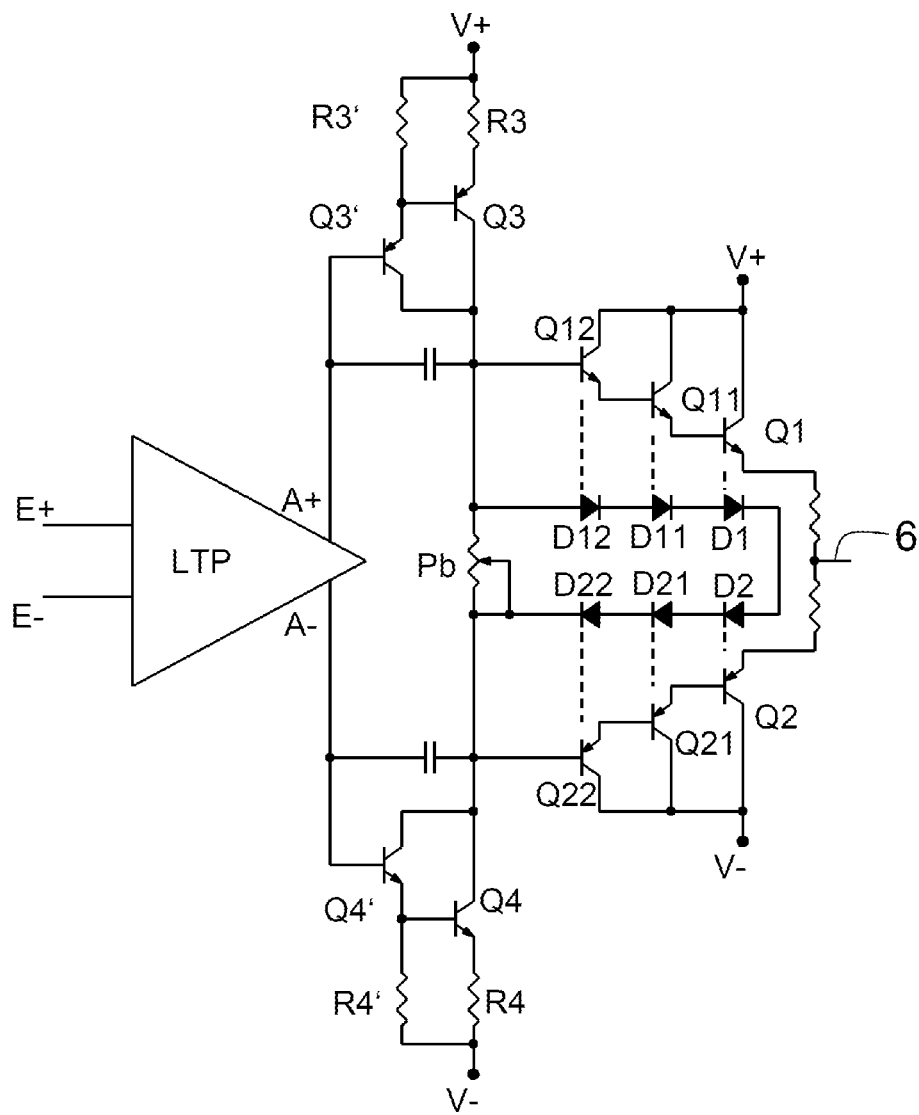
FIG. 1 shows a circuit diagram of a signal amplifier circuit in accordance with the prior art.

FIG. 1 shows a circuit diagram of a signal amplifier circuit in accordance with the prior art. This known circuit, which is embodied as an audio amplifier, can roughly be subdivided into a voltage amplifier stage (VAS) and an output stage.

The VAS is formed from a positive part having a modified Darlington stage composed of two transistors Q3, Q3' and two resistors R3, R3', and a negative part having a further modified Darlington stage composed of two transistors Q4, Q4' and two resistors R4, R4'. An input differential amplifier stage LTP (LTP—long-tailed pair) serves to amplify a signal present at the preamplifier inputs E+, E− and to provide that at the preamplifier outputs A+, A−. The preamplified signal passes through the voltage amplifier stage, a positive oscillation cycle of the signal passing through the positive part and a negative oscillation cycle passing through the negative part of the voltage amplifier stage in order to reach the output stage.

The output stage is composed of first amplifier transistors Q1, Q11, Q12 and second amplifier transistors Q2, Q21, Q22 in a push-pull circuit. The three first amplifier transistors Q1, Q11, Q12 illustrated here are connected to one another to form a Darlington circuit, as are the three second amplifier transistors Q2, Q21, Q22. The audio signal amplified by means of the reverse voltage amplifier stage and the output stage is finally present at the signal output 6 and can be used to drive a loudspeaker device (not illustrated).

The voltage amplifier stage and the output stage are both supplied by means of the amplifier voltage source V+, V−. A diode chain composed of bias diodes (also called sense diodes) D1, D11, D12, D2, D21, D22 is arranged in parallel with the amplifier transistors Q1, Q11, Q12, Q2, Q21, Q22 in order to provide a bias voltage which follows the thermal behavior of the amplifier transistors Q1, Q11, Q12, Q2, Q21, Q22. For this purpose, each of the bias diodes D1, D11, D12, D2, D21, D22 is thermally coupled to an associated one of the amplifier transistors Q1, Q11, Q12, Q2, Q21, Q22. In this case, the bias diode D1 is coupled to the amplifier transistor Q1, the bias diode D2 is coupled to the amplifier transistor Q2, etc. The thermal coupling is indicated by means of dashed lines in FIG. 1 and can be achieved for example by means of transistor and diode being arranged in a common housing or by means of the diode being secured to a heat sink of the associated transistor.

The threshold voltage of a diode has a negative temperature coefficient, just like the threshold voltage of the base-emitter junction of a transistor. The thermal behavior of the diode chain composed of the bias diodes D1, D11, D12, D2, D21, D22 thus reflects the thermal behavior of the series-connected base-emitter junctions of the amplifier transistors Q1, Q11, Q12, Q2, Q21, Q22, which has the effect that the bias voltage generated by means of the diode chain also experiences a corresponding thermal behavior.

The quiescent current of the voltage amplifier stage flows through the diode chain. In practice, however, the temperature coefficients of the threshold voltages of diode and transistor differ by a known factor, in the present case for instance by the factor 1.202. Moreover, in practice, the bias diodes cannot be chosen freely since amplifier transistors integrated in each case with a bias diode in a common housing are generally used. In order to compensate for these discrepancies, a bias potentiometer Pb arranged in parallel with the diode chain is provided and is used to set an offset value of the bias voltage to the smallest possible distortions of the output signal at the signal output 6 at an average expected operating temperature of the amplifier. Said offset value is dependent on the quiescent current through the voltage amplifier stage. Said quiescent current is in turn greatly dependent on temperature, primarily if the output stage is optimized for speed. This results in an undesired fluctuation of the bias voltage.

In order to reduce or even avoid such fluctuations, according to the invention the bias diodes D1, D11, D12, D2, D21, D22 are fed by a precision constant-current source Ib, which is in turn supplied by means of a voltage source Vb which is independent of the amplifier voltage source V+, V−. A bias amplifier Ab is provided in order to carry out the adaptation of the temperature coefficients of the bias diodes D1, D11, D12, D2, D21, D22 to those of the amplifier transistors Q1, Q11, Q12, Q2, Q21, Q22. It has a corresponding gain factor of approximately 1.202.

The output of the bias amplifier Ab can both emit current and take up current. If said bias amplifier Ab were not present, then a voltage drop caused by the quiescent current of the voltage amplifier stage would arise across the bias resistor Rb. If said voltage drop is above the value corresponding to an optimum bias voltage set, then the bias amplifier Ab takes up so much current that the correct bias voltage is established again. By contrast, if the quiescent current of the voltage amplifier stage is too low to generate the required voltage drop, then the bias amplifier Ab correspondingly outputs an additional current in order to achieve the desired bias voltage. This has the consequence that the bias voltage dropped across the bias resistor Rb is independent of the quiescent current of the voltage amplifier stage and moreover exactly compensates for the temperature response of the amplifier transistors.

The bias amplifier Ab is a precision amplifier. It is preferably frequency-compensated in such a way that it can drive capacitive loads.

Figure 2:
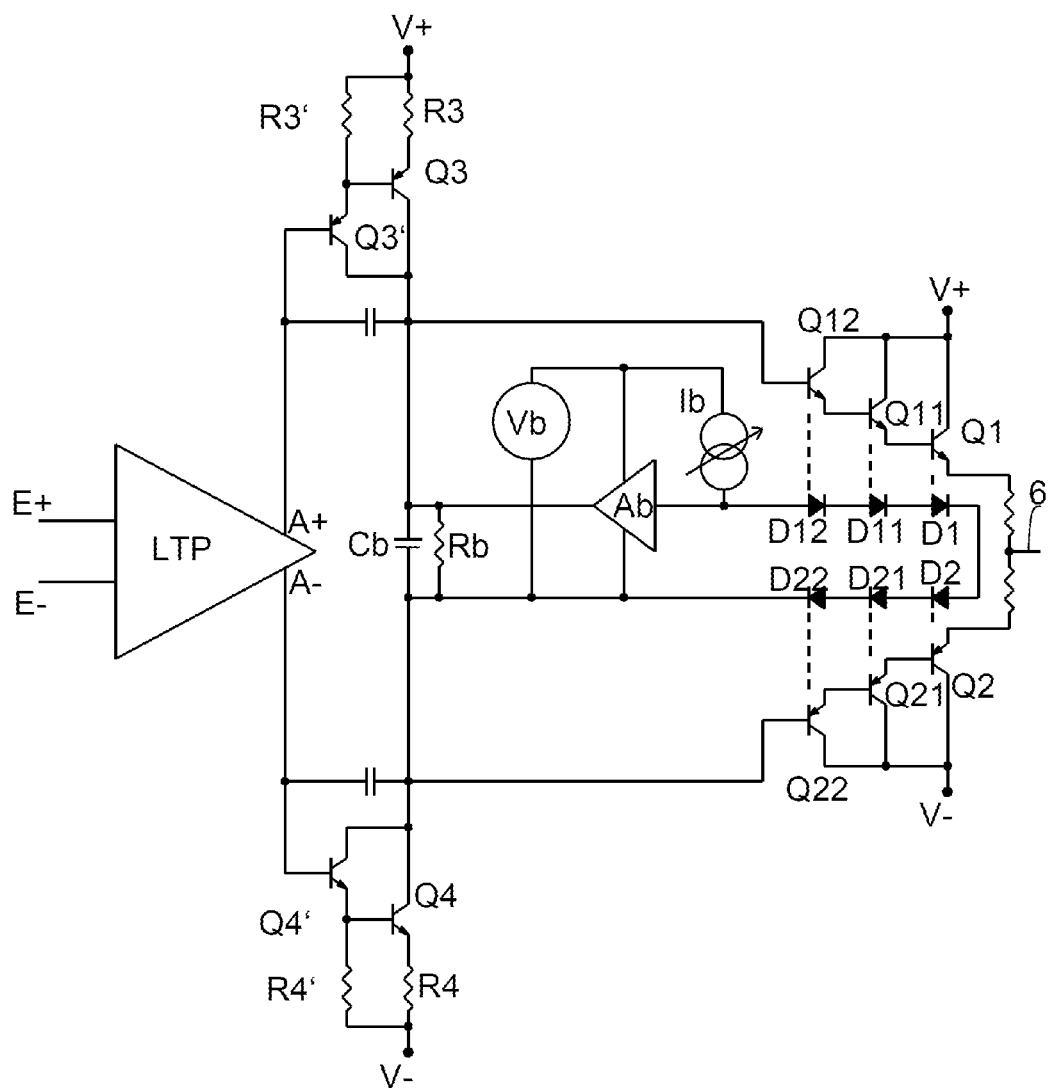
FIG. 2 shows a circuit diagram of a signal amplifier circuit in accordance with one embodiment of the invention.

The arrangement comprising bias amplifier Ab, constant-current source Ib and voltage source Vb as shown in FIG. 2 merely involves a schematic illustration of a bias circuit for setting and regulating the bias voltage generated by means of the diode chain. This bias circuit operates substantially in the DC voltage range. In order to preclude interaction with the signal frequency, a bias capacitor Cb is provided. This bias capacitor Cb constitutes a short circuit in the frequency range of the signal to be amplified. It is therefore not necessary to design the functional groups of the bias circuit toward good properties in the signal frequency range or signal frequency band.

Figure 3:
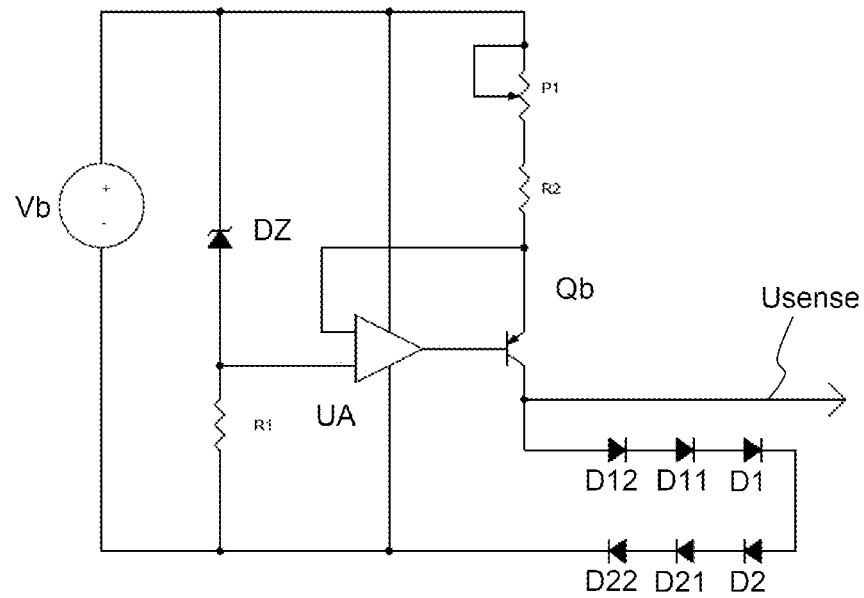
FIG. 3 shows a circuit diagram of a constant-current source for supplying bias diodes in accordance with one preferred embodiment.

One advantageous embodiment of the constant-current source Ib of the bias circuit is illustrated in FIG. 3. In this embodiment, the constant-current source Ib is realized by means of an operational amplifier UA and some further components.

At a Zener diode DZ preferably implemented as a bandgap reference with an additional feedback, not illustrated in FIG. 3, said Zener diode functioning as a shunt reference voltage source, a voltage is dropped with high absolute accuracy, which voltage is moreover highly thermostable. The operational amplifier UA impresses this voltage present at its positive input across a series circuit comprising a potentiometer P1 and a resistor R1. The current flow through the potentiometer P1 and the resistor R1 is thus equal to the voltage dropped across the Zener diode DZ divided by the sum of the resistances of the potentiometer P1 and of the resistor R1. This current also flows into the emitter input of a transistor Qb, the base of which is connected to the output of the operational amplifier UA. The base current of the transistor Qb can be disregarded in the context of the accuracy relevant here, and so the collector current of the transistor Qb is also impressed and is equal to the current which flows through the potentiometer P1 and the resistor R1. The collector current, which also flows through the diode chain of the bias diodes D1, D11, D12, D2, D21, D22, is thus independent of the potential present at the collector. A defined and thermostable current thus flows through the bias diodes D1, D11, D12, D2, D21, D22. The current of this constant-current source Ib is controlled by the setting of the potentiometer P1. The signal at the collector of the transistor Qb, said signal being identified by "Usense", is fed as input signal to the bias amplifier Ab from FIG. 2.

Figure 4:
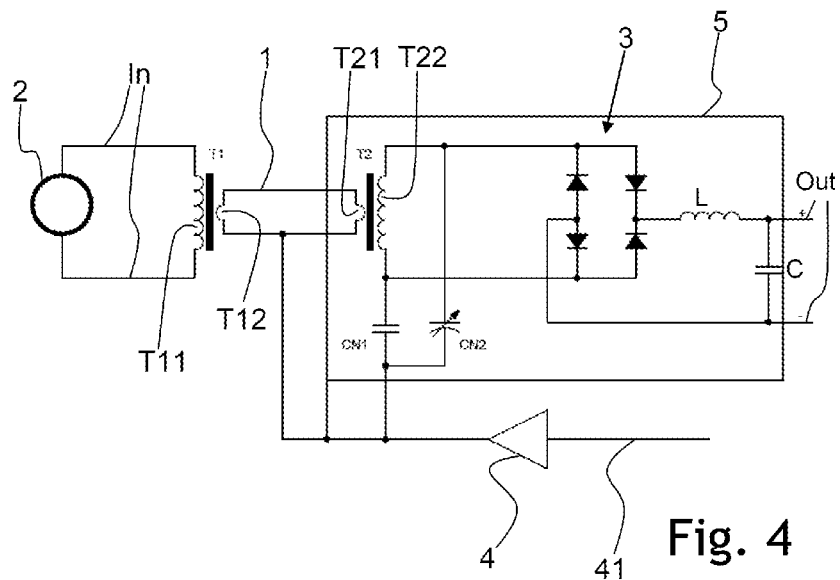
FIG. 4 shows a circuit diagram of a floating voltage source in accordance with one preferred embodiment for supplying the bias diodes.

The operational amplifier UA and also the other elements of the bias circuit in FIG. 3 are supplied by means of the floating voltage source Vb. One preferred embodiment of the voltage source Vb is illustrated in FIG. 4. The voltage source Vb has input terminals In and output terminals Out. The input terminals In are fed by a primary AC voltage 2. At the output terminals Out, the voltage source Vb provides the DC voltage that drives the bias circuit, which can be constructed for example as illustrated in FIG. 3.

The central element of the voltage source Vb is two transformers T1, T2 connected to one another in succession and respectively having primary windings T11, T21 and secondary windings T12, T22. The first primary winding T11 is supplied with the primary AC voltage 2 via the input terminals In, while an AC voltage is present at the second secondary winding T22, said AC voltage being substantially equal to the primary AC voltage 2 in the case of structurally identical transformers T1, T2. The first secondary winding T12 and the second primary winding T21 are formed by a short-circuited turn 1. The latter is a short-circuited piece of wire which passes through the two cores of the transformers T1, T2.

The AC voltage formed in the second secondary winding T22 is rectified by means of a rectifier composed of a diode bridge 3 and a low-pass filter comprising a rectifier inductance L and a rectifier capacitance C.

The short-circuited turn 1 is kept at a reference potential. This is referred to as bootstrapping and is effected by the short-circuited turn 1 being connected via an impedance converter 4 to the reference potential present at an impedance converter input 41. The reference potential is the signal which is amplified in the signal amplifier circuit, or the reference potential follows this signal. In the embodiment shown here, the reference potential is tapped off at the bias resistor Rb and is fed to the impedance converter 4 at the impedance converter input 41.

In addition to the bootstrapping of the short-circuited turn 1, the two terminals of the output of the second transformer T2, namely the two ends of the second secondary winding T22, are connected to the reference potential via a first corrective capacitance CN1 and a second corrective capacitance CN2. In this case, the second corrective capacitance CN2 is embodied as an adjustable capacitor. By means of the two corrective capacitances CN1, CN2, the stray capacitances present with respect to the reference potential from each end of the second secondary winding T22 are compensated for by the second corrective capacitance CN2 being adjusted while observing the output signal at the signal output 6 of the signal amplifier circuit.

Finally, a shield 5 of the second transformer T2, of the rectifier comprising the diode bridge 3 and the LC circuit, and of the corrective capacitances CN1, CN2 is symbolized schematically in FIG. 4. The shield 5 is, in particular, a metal cage that encloses the circuit and thus covers the shielded components. The shield is likewise kept at the reference potential.

The voltage converter described below with reference to FIGS. 5 to 8 can be used as a voltage source which is independent of the amplifier voltage source for supplying the bias diodes or a bias circuit, as described above. As explained in the introduction, however, the voltage converter can instead also be used for providing a voltage for other consumers and in entirely different fields of application.

Figure 5:
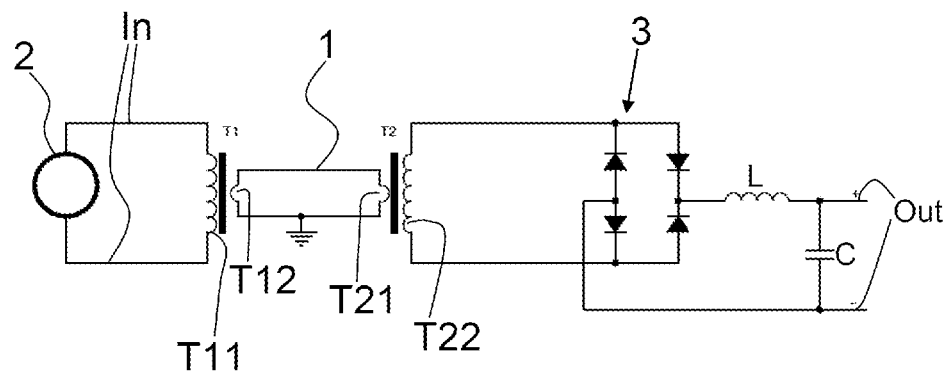
FIG. 5 shows a circuit diagram of a voltage converter in accordance with one preferred embodiment.

FIG. 5 schematically illustrates a voltage converter in accordance with one preferred embodiment by means of a circuit diagram. As also in the following figures, only the most important components for describing the invention are shown here. The voltage converter comprises input terminals In and output terminals Out. The input terminals In are fed by a primary AC voltage 2. At the output terminals Out, the voltage converter provides a DC voltage for supplying one or more consumers, the consumers not being illustrated in the figures.

The central element of the voltage converter is two transformers T1, T2 connected to one another in succession and respectively having primary windings T11, T21 and secondary windings T12, T22. The first primary winding T11 is supplied with the primary AC voltage 2 via the input terminals In, while an AC voltage is present at the second secondary winding T22, said AC voltage being substantially equal to the primary AC voltage 2 in the case of structurally identical transformers T1, T2. The first secondary winding T12 and the second primary winding T21 are formed by a short-circuited turn 1. The latter is a short-circuited piece of wire which passes through the two cores of the transformers T1, T2. With preference, the short-circuited turn 1 crosses between the two cores and thus forms an eight. The short-circuited turn 1 is grounded in the embodiment in accordance with FIG. 5.

The AC voltage formed in the second secondary winding T22 is rectified by means of a rectifier composed of a diode bridge 3 and a low-pass filter comprising a rectifier inductance L and a rectifier capacitance C.

The grounding of the short-circuited turn 1 that is carried out in accordance with this first embodiment constitutes one measure for reducing or avoiding common-mode interference voltages at the output terminals Out. Other measures are illustrated schematically in the subsequent FIGS. 6 to 4.

In these subsequent exemplary embodiments, it is possible to maintain the basic construction of the voltage converter as described above.

Figure 6:
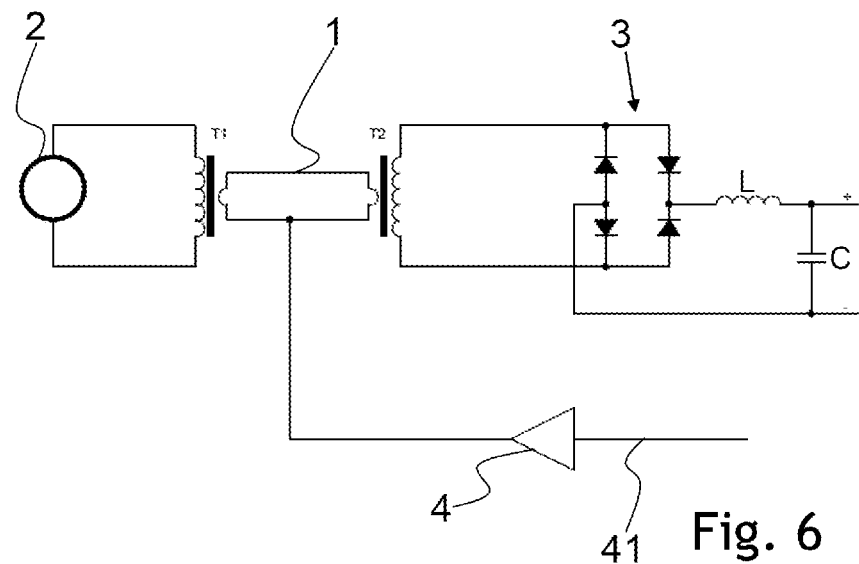
FIG. 6 shows a circuit diagram of a voltage converter in accordance with a further preferred embodiment with bootstrapping.
Figure 7:
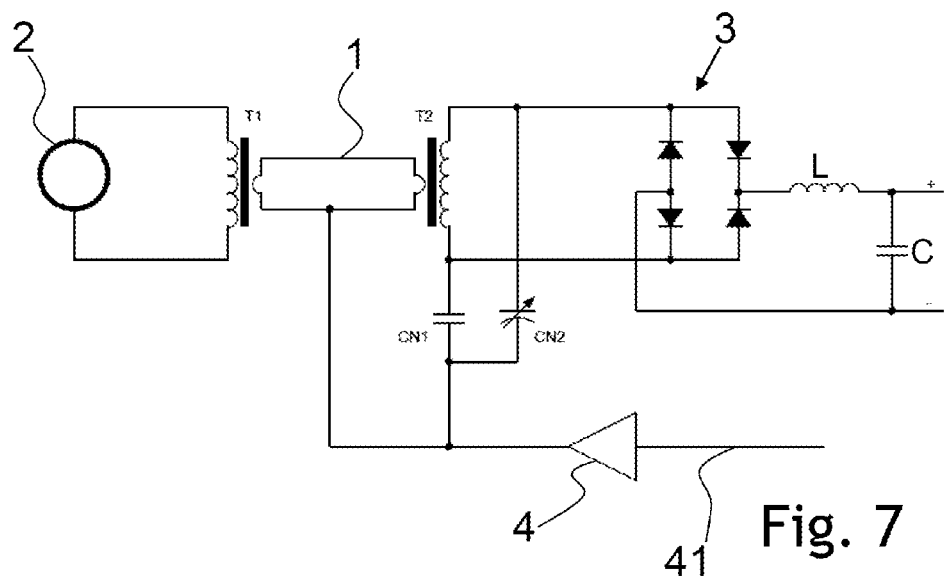
FIG. 7 shows a circuit diagram of a voltage converter in accordance with a further preferred embodiment with bootstrapping and corrective capacitances.

In the embodiment in accordance with FIG. 6, the short-circuited turn 1 is kept at a reference potential instead of being grounded. This is done by the short-circuited turn 1 being connected via an impedance converter 4 to the reference potential present at an impedance converter input 41. The voltage converter supplies a consumer (not illustrated) via its output terminals Out. The reference potential is a signal which is processed in said consumer, or the reference potential follows this signal processed in the consumer.

In addition to the bootstrapping of the short-circuited turn 1 as described in FIG. 6, the two terminals of the output of the second transformer T2, namely the two ends of the second secondary winding T22, are connected to the reference potential via a first corrective capacitance CN1 and a second corrective capacitance CN2. As an alternative to the reference potential, the two corrective capacitances CN1, CN2 can be grounded just like the short-circuited turn 1 in FIG. 5.

In this case, the second corrective capacitance CN2 is embodied as an adjustable capacitor. By means of the two corrective capacitances CN1, CN2, the stray capacitances present with respect to the reference potential from each end of the second secondary winding T22 are compensated for by the second corrective capacitance CN2 being adjusted while observing the output signal of the consumer or the voltage measured at the output terminals Out.

Figure 8:
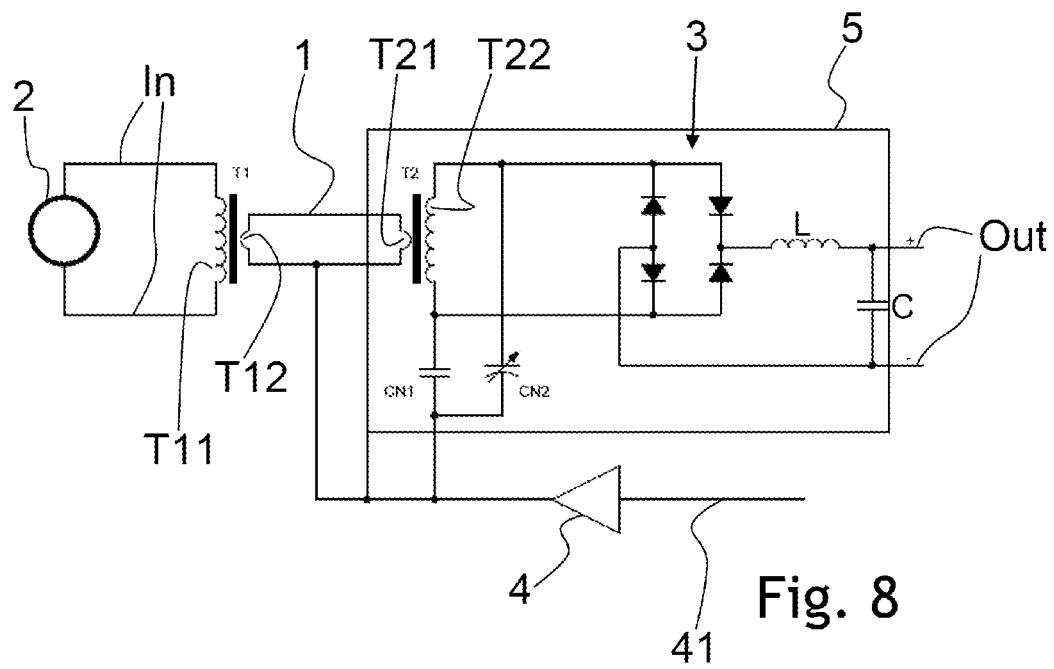
FIG. 8 shows a circuit diagram of a voltage converter in accordance with a further preferred embodiment with three compensation measures.

Finally, FIG. 8 schematically illustrates a shield 5 of the second transformer T2, of the rectifier comprising the diode bridge 3 and the LC circuit, and of the corrective capacitances CN1, CN2. The shield 5 is, in particular, a metal plate that is arranged above the circuit and covers the shielded components. The shield is likewise kept at the reference potential. Alternatively, the shield can be grounded just like the short-circuited turn 1 in FIG. 5.

LIST OF REFERENCE SIGNS

1 Short-circuited turn
2 Primary AC voltage
3 Diode bridge
4 Impedance converter
41 Impedance converter input
5 Shield
6 Signal output
A+, A− Preamplifier outputs
Ab Bias amplifier
C Rectifier capacitance
Cb Bias capacitor
CN1 First corrective capacitance
CN2 Second corrective capacitance
D1, D11, D12, D2, D21, D22 Bias diode (sense diode)
DZ Zener diode
E+, E− Preamplifier inputs
Ib Constant-current source
In Input terminals
L Rectifier inductance
LTP Input differential amplifier stage
Out Output terminals
P1 Potentiometer
Pb Bias potentiometer
Q1, Q11, Q12 First amplifier transistors
Q2, Q21, Q22 Second amplifier transistors
Q3, Q3', R3, R3' Voltage amplifier stage, positive
Q4, Q4', R4, R4' Voltage amplifier stage, negative
Qb Transistor
R2 Resistor
Rb Bias resistor
T1 First transformer
T11 First primary winding
T12 First secondary winding
T2 Second transformer
T21 Second primary winding
T22 Second secondary winding
UA Operational amplifier
V+, V− Amplifier voltage source
Vb Voltage source

The invention claimed is:

1. A voltage converter for providing an output-side DC voltage, comprising:
input terminals (In) for connecting to a primary AC voltage (2);
output terminals (Out), at which the DC voltage provided is able to be tapped off;
a first transformer (T1) having a first primary winding (T11), which is fed by the input terminals (Out), and a first secondary winding (T12), said first transformer being connected to the input terminals (In);
a second transformer (T2) having a second primary winding (T21) and a second secondary winding (T22), which is connected to a rectifier (3, L, C), said second transformer being connected to the first transformer (T1); and
the rectifier (3, L, C), which is arranged between the second secondary winding (T22) of the second transformer (T2) and the output terminals (Out) and is configured to rectify an AC voltage present at the second secondary winding (T22) to form the DC voltage provided at the output terminals (Out), wherein the first secondary winding (T12) of the first transformer (T1) is connected to the second primary winding (T21) of the second transformer (T2).

2. The voltage converter according to claim 1, wherein the first secondary winding (T12) of the first transformer (T1) is directly connected to the second primary winding (T21) of the second transformer (T2).

3. The voltage converter according to claim 1, wherein the first secondary winding (T12) and/or the second primary winding (T21) have/has a maximum of five turns.

4. The voltage converter according to claim 3, wherein the first secondary winding (T12) and/or the second primary winding (T21) have/has a maximum of three turns.

5. The voltage converter according to claim 3, wherein the first secondary winding (T12) and/or the second primary winding (T21) have/has a maximum of one turn.

6. The voltage converter according to claim 1, wherein the first transformer (T1) and the second transformer (T2) have substantially the same construction.

7. The voltage converter according to claim 1, wherein the second transformer (T2) and/or the rectifier (3, L, C) are/is partly or completely surrounded by a shield connected to a terminal of the second primary winding (T21) of the second transformer (T2).

8. The voltage converter according to claim 1, wherein a terminal of the second primary winding (T21) of the second transformer (T2) and/or a terminal of the first secondary winding (T12) of the first transformer (T1) are/is grounded.

9. The voltage converter according to claim 1, wherein a terminal of the second secondary winding (T22) of the second transformer (T2), via a first corrective capacitance (CN1), and/or wherein a further terminal of the second secondary winding (T22), via a second corrective capacitance, are/is connected to ground.

10. The voltage converter according to claim 9, wherein the first corrective capacitance (CN1) and/or the second corrective capacitance (CN2) are/is adjustable.

11. A system comprising the voltage converter according to claim 1 and a signal-processing consumer which is connected to the output terminals (Out) and is supplied with the DC voltage provided at the output terminals (Out).

12. The system according to claim 11, wherein the consumer is a signal amplifier for the signal.

13. The system according to claim 12, wherein the consumer is an output stage of an audio amplifier.

14. A system comprising the voltage converter according to claim 1 and a signal-processing consumer which is connected to the output terminals (Out) and is supplied with the DC voltage provided at the output terminals (Out), wherein a terminal of the second primary winding (T21) of the second transformer (T2) and/or a terminal of the first secondary winding (T12) of the first transformer (T1) are/is dynamically kept at a reference potential which follows a signal processed in the consumer.

15. A system comprising the voltage converter according to claim 1 and a signal-processing consumer which is connected to the output terminals (Out) and is supplied with the DC voltage provided at the output terminals (Out), wherein a terminal of the second secondary winding (T22) of the second transformer (T2), via a first corrective capacitance (CN1), and/or a further terminal of the second secondary winding (T22), via a second corrective capacitance (CN2), are/is dynamically connected to a reference potential which follows a signal processed in the consumer.

16. The system according to claim 15, wherein the first corrective capacitance (CN1) and/or the second corrective capacitance (CN2) are/is adjustable.

* * * * *